(12) United States Patent
Lai et al.

(10) Patent No.: US 6,430,049 B1
(45) Date of Patent: Aug. 6, 2002

(54) CLIP FOR HEAT SINK

(75) Inventors: Cheng Tien Lai, Taipei (TW); Chao Wang, Shenzhen (CN)

(73) Assignee: Foxconn Precision Components Co., Ltd. (TW)

( * ) Notice: Subject to any disclaimer, the term of this patent is extended or adjusted under 35 U.S.C. 154(b) by 82 days.

(21) Appl. No.: 09/746,654

(22) Filed: Dec. 22, 2000

(51) Int. Cl.⁷ .................................................. H05K 7/20
(52) U.S. Cl. ........................ 361/704; 361/690; 361/694; 361/707; 361/709; 361/719; 361/818; 174/16.3; 165/80.3; 257/718; 257/719; 257/727; 411/516; 24/458
(58) Field of Search ................................ 361/704, 707, 361/709, 719, 717, 718; 174/16.3; 165/80.3, 185; 257/718, 719, 727; 24/458, 459; 248/510

(56) References Cited

U.S. PATENT DOCUMENTS

| | | | | |
|---|---|---|---|---|
| 5,570,271 A | * | 10/1996 | Lavochkin | 361/704 |
| 5,594,624 A | * | 1/1997 | Clemens et al. | 361/704 |
| 5,600,540 A | * | 2/1997 | Blomquist | 361/704 |
| 5,617,292 A | * | 4/1997 | Steiner | 361/704 |
| 6,205,026 B1 | * | 3/2001 | Wong et al. | 361/704 |
| 6,226,186 B1 | * | 5/2001 | Chien | 361/704 |
| 6,250,375 B1 | * | 6/2001 | Lee et al. | 165/80.3 |

* cited by examiner

Primary Examiner—Leo P. Picard
Assistant Examiner—Boris L. Chervinsky

(57) ABSTRACT

A clip (10) for securing a heat sink (20) to an electronic device (30) includes a body (12) and a pair of fasteners (16) attached to opposite ends of the body. The body has a pressing portion (122), a pair of first connection portions (126) extending away from opposite ends of the pressing portion, and a fixing portion (134) depending from the pressing portion. The fixing portion includes a pair of stopping tabs (138). The pressing portion and the fixing portion each form a projection (142). The stopping tabs are received in cutouts (28) of the heat sink, to prevent the clip from moving parallel to grooves (26) defined in the heat sink. The projections are received in the grooves, to prevent the clip from moving perpendicular to the grooves. Thus a pair of clips and the heat sink are securely combined to form a single assembly (50).

12 Claims, 5 Drawing Sheets

CLIP FOR HEAT SINK

BACKGROUND OF THE INVENTION

1. Field of the Invention

The present invention relates to a clip for a heat sink, and particularly to a clip which is pre-attached on a heat sink before the heat sink is attached to an electronic device.

2. Related Art

Computer electronic devices such as central processing units (CPUs) frequently generate large amounts of heat, which can destabilize operation and cause damage. A heat sink placed in thermal contact with an electronic device mounted on a socket transfers heat from the electronic device through conduction. Oftentimes, a heat sink is secured to an electronic device by a clip.

A conventional clip comprises a spring portion and two downwardly extending legs. Each leg defines an opening detachably engaging with a corresponding catch formed on a side of a socket, to secure a heat sink on an electronic device mounted on the socket. This kind of clip remains separated from the heat sink before the heat sink is attached on the electronic device. Various conventional clips are commercially available, and every consumer needs to take care that they use a clip which correctly matches their heat sink. Nevertheless, consumers still sometimes mistakenly purchase a wrong clip for a heat sink or use a wrong clip to secure a heat sink to an electronic device. Furthermore, an additional job is needed to prepare a clip for attaching a heat sink to an electronic device, which is time-consuming.

Examples of conventional clips are disclosed in Taiwan Patent Applications Nos. 85211135, 85214941 and 86213035, and U.S. Pat. Nos. 5,602,719 and 5,600,540.

SUMMARY OF THE INVENTION

Accordingly, an object of the present invention is to provide a clip which is pre-attached on a heat sink before the heat sink is attached to an electronic device.

To achieve the above-mentioned object, a clip for securing a heat sink to an electronic device in accordance with the present invention comprises a body and a pair of fasteners attached to opposite ends of the body. The body has a central pressing portion, a pair of first connection portions extending away from opposite ends of the pressing portion, and a fixing portion depending from one side edge of the pressing portion. The fixing portion includes a pair of stopping tabs. The pressing portion and the fixing portion each form a projection. The stopping tabs are received in cutouts of the heat sink, to prevent the clip from moving in a first direction parallel to grooves defined in the heat sink. The projections are received in the grooves of the heat sink, to prevent the clip from moving in a second direction perpendicular to the grooves. Thus a pair of clips and the heat sink are securely combined to form a single assembly.

Other objects, advantages and novel features of the present invention will be drawn from the following detailed embodiment of the present invention with attached drawings, in which:

DESCRIPTION OF THE PREFERRED EMBODIMENT

Figure 1:
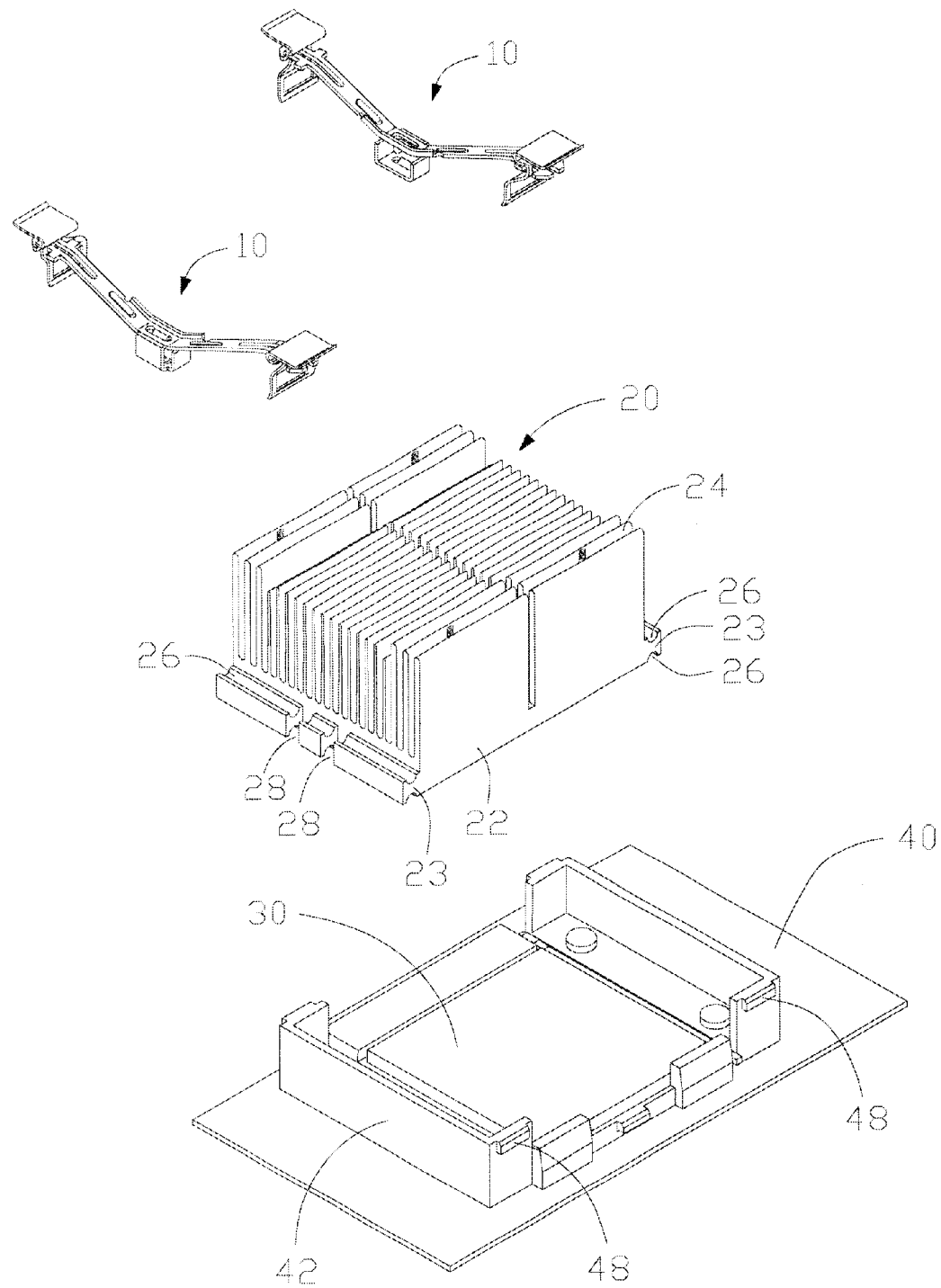
FIG. 1 is an exploded view of a pair of clips of the present invention, for attaching a heat sink to an electronic device mounted on a printed circuit board.

FIG. 1 is an exploded view of a heat sink 20, an electronic device 30 mounted on a printed circuit board (PCB) 40, a pair of retention modules 42 respectively mounted on opposite sides of the electronic device 30, and a pair of clips 10 in accordance with the present invention.

The heat sink 20 comprises a base 22, and a plurality of fins 24 extending upwardly from the base 22. A pair of protrusions 23 extends horizontally from respective opposite sides of the base 22. Each protrusion 23 defines a pair of symmetric grooves 26 in opposite upper and lower surfaces thereof respectively. A pair of spaced cutouts 28 is defined in each protrusion 23, perpendicular to the grooves 26.

Each retention module 42 is secured on the PCB 40 by conventional means. A pair of external catches 48 is respectively formed on opposite ends of each retention module 10.

Figure 2:
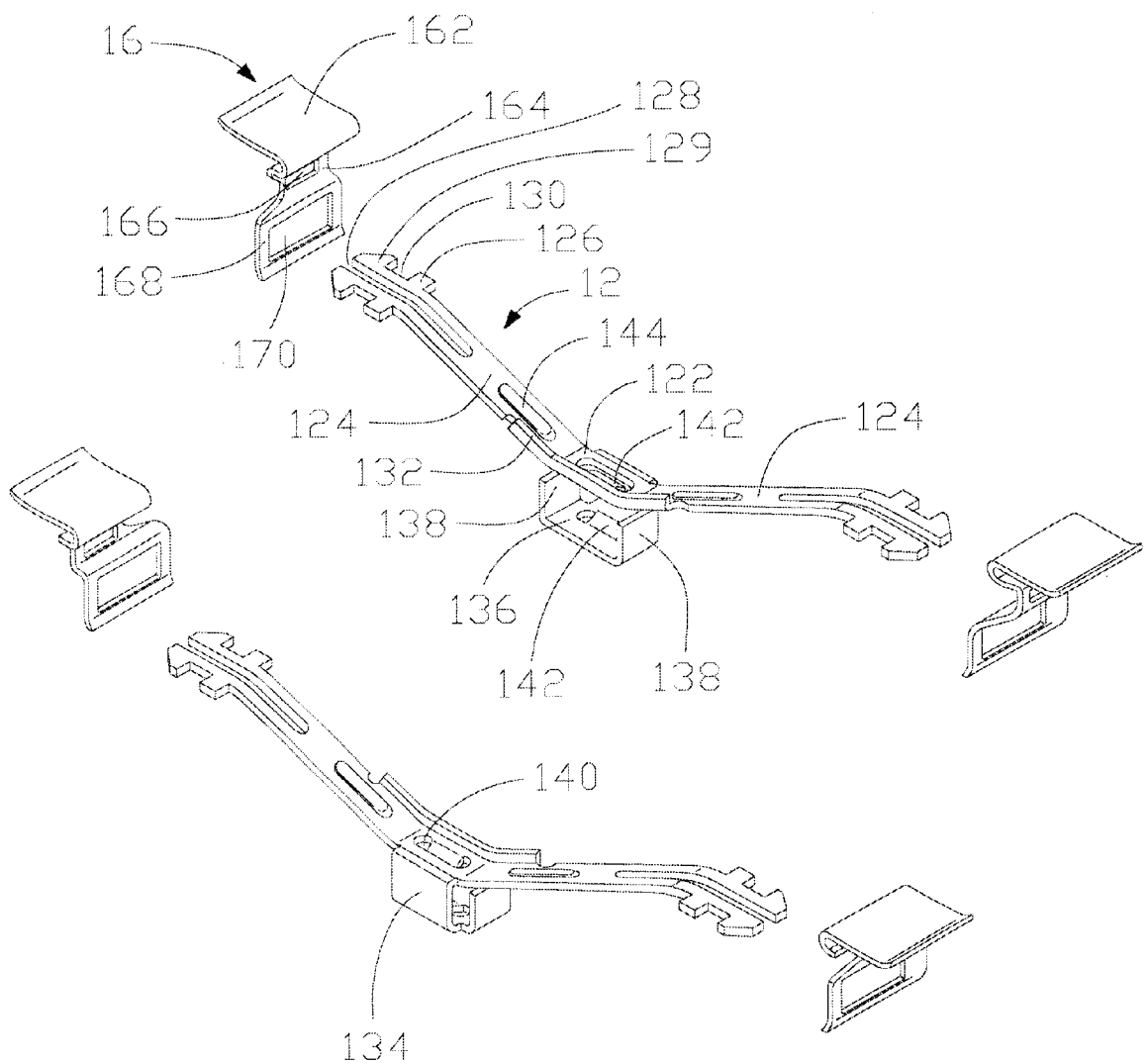
FIG. 2 is an enlarged perspective view of the pair of clips of FIG. 1.

Referring also to FIG. 2, each clip 10 in accordance with the present invention comprises a body 12 and a pair fasteners 16 releasably attached to opposite ends of the body 12 respectively. The bodies 12 are similar in structure to each other, and the fasteners 16 are similar in structure to one another. Each body 12 is a mirror image of the other body 12. Each fastener 16 attached to an end of a body 12 is a mirror image of the other fastener 16 attached to the other end of the same body 12. Each fastener 16 attached to an end of a body 12 is identical to a diagonally opposite fastener 16 attached to an end of the other body 12.

Each body 12 comprises a central horizontal pressing portion 122, a pair of spring portions 124 respectively extending in opposite directions from the pressing portion 122, and a pair of first connection portions 126 respectively extending from opposite distal ends of the spring portions 124. A flange 132 extends upwardly from one side edge of the pressing portion 122 and the spring portions 124, for reinforcing the body 12. A fixing portion 134 depends from the other side edge of the pressing portion 122, opposite to the flange 132. The fixing portion 134 comprises a horizontal tab 136, opposite to the pressing portion 122. A pair of vertical stopping tabs 138 extends upwardly from opposite sides of the horizontal tab 136 respectively. The pressing portion 122 and the horizontal tab 136 each define a slot 140 therein. An inwardly inclined projection 142 is formed on each of the pressing portion 122 and the horizontal tab 136, at an edge thereof adjacent the corresponding slot 140. Each spring portion 124 forms a rib 144 thereon, for reinforcing the clip 10. Each first connection portion 126 and an adjacent portion of the corresponding spring portion 124 defines a longitudinal split 128 therein, for facilitating extension of the first connection portion 126 into the fastener 16. A pair of barbs 129 is formed at a free end of each first connection portion 126, on opposite sides of the split 128 respectively. Each first connection portion 126 defines a pair of rectangular notches 130 in opposite sides thereof respectively, adjacent the barbs 129.

Each fastener 16 is generally L-shaped, and comprises a handle 162, a leg 168, and a second connection portion 164 between the handle 162 and the leg 168. A first opening 166 is defined in the second connection portion 164, for receiving the corresponding first connection portion 126 of the body 12. A second opening 170 is defined in the leg 168 below the first opening 166, for receiving the corresponding catch 48 of the retention module 42.

Figure 3:
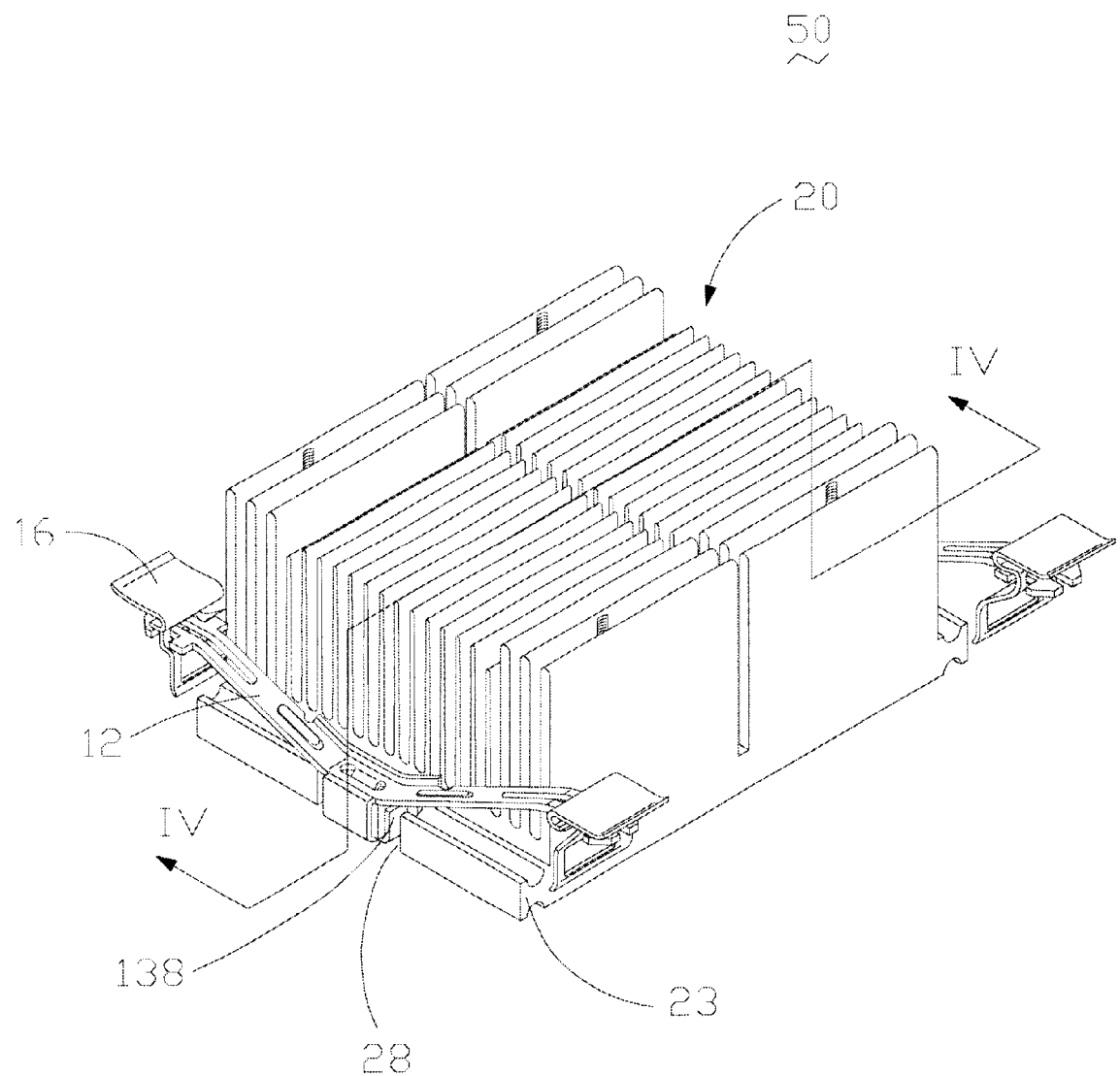
FIG. 3 is an assembled view of the pair of clips and the heat sink of FIG. 1.
Figure 4:
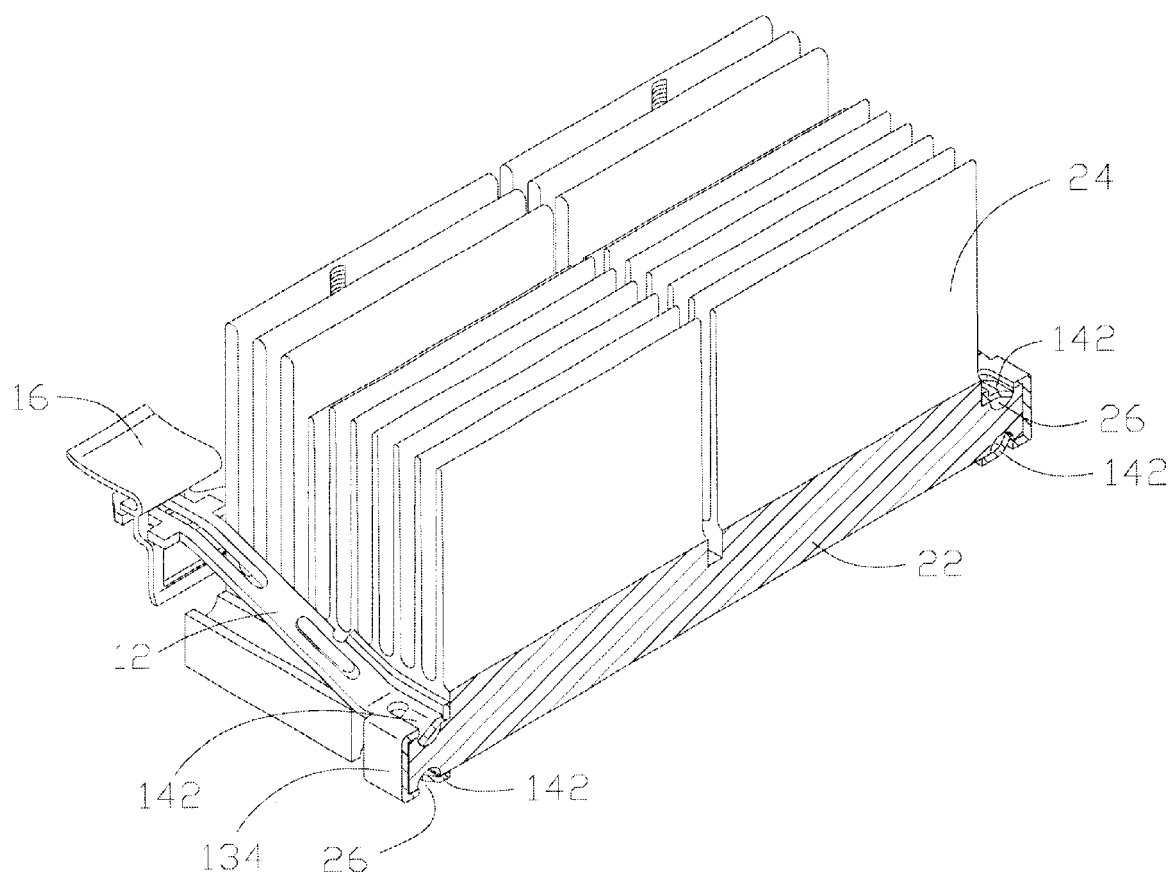
FIG. 4 is a perspective cross-sectional view of FIG. 3, taken along the line IV—IV.

Referring also to FIGS. 3 and 4, in pre-assembly, each fastener 16 is attached to the corresponding first connection portion 126 of the body 12. The barbs 129 of each first connection portion 126 of the body 12 are extended through the first opening 166 of the corresponding fastener 16, and the second connection portion 164 of the fastener 16 is received in the notches 130 of the first connection portion 126. The clips 10 are then attached to the corresponding protrusions 23 on opposite sides of the heat sink 20. The stopping tabs 138 of each clip 10 are inserted in the corresponding cutouts 28 of the protrusion 23, thereby preventing the clip 10 from moving in a first direction defined as being parallel to the grooves 26 of the heat sink 20. The projections 142 of each clip 10 are received in the corresponding grooves 26 of the heat sink 20, thereby preventing the clip 10 from moving in a second direction defined as being perpendicular to the grooves 26. The clips 10 and the heat sink 20 are thus securely combined to form a single assembly 50.

Figure 5:
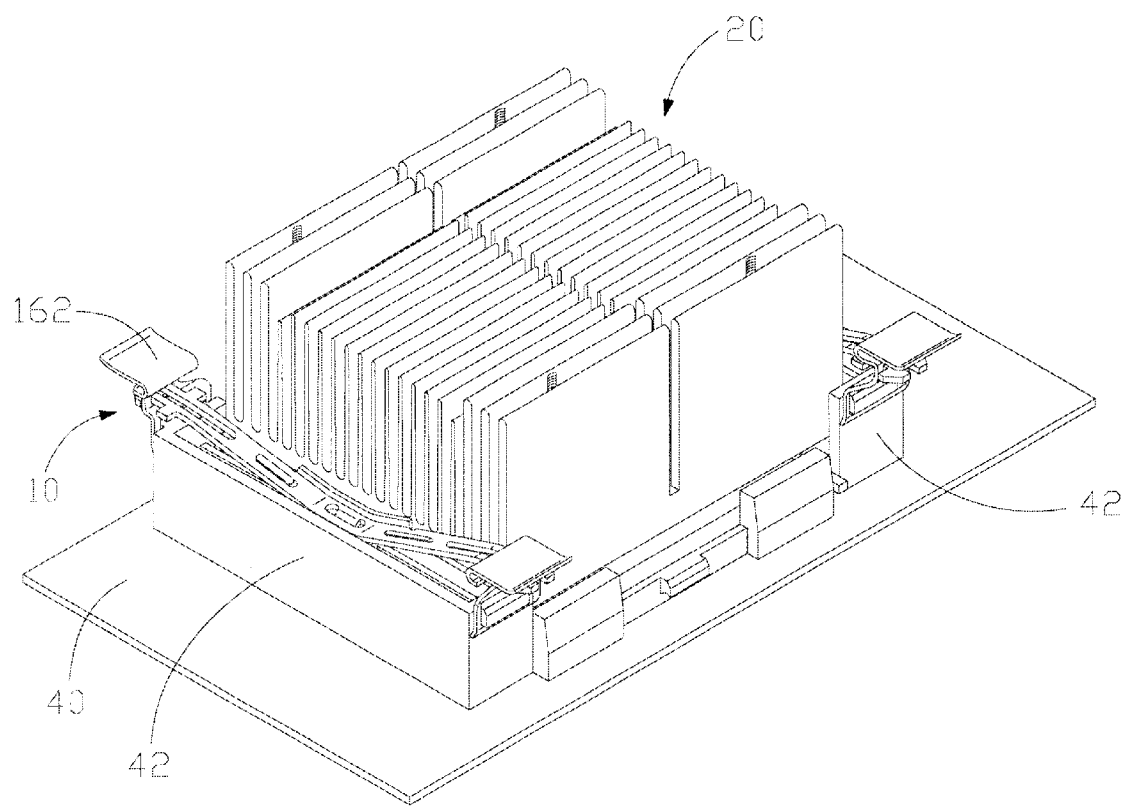
FIG. 5 is an assembled view of FIG. 1.

Referring also to FIG. 5, in assembly, the assembly 50 of the heat sink 20 and the clips 10 is placed on the electronic device 30 between the pair of retention modules 42. Using the handles 162, two diagonally opposite fasteners 12 are pressed downwardly to allow the second openings 170 thereof to engagingly receive the corresponding catches 48 of the retention modules 42. The other two diagonally opposite fasteners 12 are then pressed downwardly to allow the second openings 170 thereof to engagingly receive the remaining corresponding catches 48 of the retention modules 42. The assembly 50 of the heat sink 20 and the clips 10 is thus easily secured on the electronic device 30.

When the assembly 50 comprising the heat sink 20 with pre-attached clip 10 is commercially distributed, consumers will never mistakenly purchase or use a wrong clip for their desired heat sink.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted to secure a heat sink to an electronic device mounted between a pair of retention modules, comprising:
   a body (12) comprising a pressing portion adapted to press the heat sink onto the electronic device, and a fixing portion (134) depending from one side edge of tic pressing portion and adapted to attach the clip to the heat sink, the fixing portion comprising a horizontal tab (136) opposite to the pressing portion and at least one stopping tab (138) adapted to prevent the clip from moving in a first direction relative to the heat sink, the stopping tab extending upwardly from the horizontal tab; and
   a pair of fasteners disengageably attached to opposite ends of the body and adapted to engage with the corresponding retention module.

2. The clip as claimed in claim 1, wherein the horizontal tab of the fixing portion of the body comprises at least one projection (142) adapted to prevent the clip from moving in a second direction relative to the heat sink, said second direction being perpendicular to said first direction.

3. The clip as claimed in claim 1, wherein the pressing portion of the body forms at least one projection adapted to prevent the clip from moving in a second direction relative to the heat sink, said second direction being perpendicular to said first direction.

4. The clip as claimed in claim 1, wherein the body further comprises a pair of first connection portions (126) extending away from opposite ends of the pressing portion, and each fastener comprises a second connection portion (164) engaging with the corresponding first connection portion to thereby attach the fastener to the body.

5. The clip as claimed in claim 4, wherein the second connection portion (164) of each fastener defines a first opening therein for extension of the corresponding first connection portion of the body therethrough, and each first connection portion defines a pair of notches (130) therein for receiving the corresponding second connection portion therein.

6. The clip as claimed in claim 5, wherein each first connection portion of each fastener further defines a split (128) therein for facilitating extension of the first connection portion through the first opening of the corresponding clip.

7. The clip as claimed in claim 1, wherein the body forms a flange (132) and a pair of ribs (144) to reinforce the clip.

8. An electronic device assembly comprising:
   a printed circuit board (40);
   an electronic device (30) mounted on the printed circuit board;
   at least one retention module (42) mounted beside the electronic device;
   a heat sink (20) placed on the electronic device, the heat sink having at least one groove (26) and at least one cutout (28) on at least one side thereof; and
   at least one clip comprising a body and a pair of fasteners attached to the body, the body having a pressing portion for pressing the heat sink onto the electronic device, at least one stopping tab for being received in the at least one cutout to prevent the clip from moving in a first direction relative to the heat sink, and at least one projection for being received in the at least one groove to prevent the clip from moving in a second direction relative to the heat sink, said second direction being perpendicular to said first direction, and wherein the fasteners engage with the at least one retention module to securely attach the heat sink to the electronic device.

9. The electronic device assembly as claimed in claim 8, wherein the body of each clip has a pair of first connection portions, and each fastener has a second connection portion for engaging with the corresponding first connection portion.

10. The clip as claimed in claim 9, wherein the second connection portion (164) of each fastener defines a first opening for extension of the corresponding first connection portion of the body therethrough, and each first connection portion defines a pair of notches (130) for receiving the corresponding second connection portion therein.

11. The electronic device assembly as claimed in claim 8, wherein each fastener of each clip defines a second opening therein for engaging with a corresponding catch formed on the corresponding retention module.

12. The electronic device assembly as claimed in claim 8, wherein the body of each clip forms a flange (132) and a pair of ribs (144) to reinforce the clip.

* * * * *